(12) United States Patent
Nam et al.

(10) Patent No.: US 11,848,274 B2
(45) Date of Patent: Dec. 19, 2023

(54) SEMICONDUCTOR PACKAGE

(71) Applicant: SAMSUNG ELECTRONICS CO., LTD., Suwon-si (KR)

(72) Inventors: Geol Nam, Seoul (KR); Gunho Chang, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/811,362

(22) Filed: Jul. 8, 2022

(65) Prior Publication Data

US 2022/0344271 A1    Oct. 27, 2022

Related U.S. Application Data

(63) Continuation of application No. 16/994,139, filed on Aug. 14, 2020, now Pat. No. 11,393,764.

(30) Foreign Application Priority Data

Nov. 27, 2019    (KR) .................. 10-2019-0153981

(51) Int. Cl.
*H01L 23/538*    (2006.01)
*H01L 25/065*    (2023.01)
(Continued)

(52) U.S. Cl.
CPC ........ *H01L 23/5384* (2013.01); *H01L 23/373* (2013.01); *H01L 23/5386* (2013.01); *H01L 24/14* (2013.01); *H01L 25/0657* (2013.01)

(58) Field of Classification Search
CPC . H10B 80/00; H01L 25/0652; H01L 25/0655; H01L 25/0657; H01L 24/24;
(Continued)

(56) References Cited

U.S. PATENT DOCUMENTS 7,005,734 B2    2/2006  Choi et al.
7,276,799 B2    10/2007  Lee et al.
(Continued)

FOREIGN PATENT DOCUMENTS

KR    10-1767241    8/2017

OTHER PUBLICATIONS

Notice of Allowance dated Mar. 17, 2022 in corresponding U.S. Appl. No. 16/994,139.
(Continued)

*Primary Examiner* — Jasmine J Clark
(74) *Attorney, Agent, or Firm* — F. Chau & Associates, LLC

(57) ABSTRACT

A semiconductor package includes: a base chip; a first semiconductor chip disposed on the base chip; a second semiconductor chip disposed on the first semiconductor chip; a first insulating layer disposed between the base chip and the first semiconductor chip; a second insulating layer disposed between the first semiconductor chip and the second semiconductor chip; a first connection bump penetrating through the first insulating layer and connecting the base chip and the first semiconductor chip to each other; and a second connection bump penetrating through the second insulating layer and connecting the first semiconductor chip and the second semiconductor chip to each other. The base chip has a width greater than a width of each of the first and second semiconductor chips. The first insulating layer and the second insulating layer include different materials from each other.

20 Claims, 11 Drawing Sheets

(51) Int. Cl.
*H01L 23/00* (2006.01)
*H01L 23/373* (2006.01)

(58) Field of Classification Search
CPC .............. H01L 23/373; H01L 23/5386; H01L 23/5384
See application file for complete search history.

(56) References Cited

U.S. PATENT DOCUMENTS

| | | |
|---|---|---|
| 8,274,143 B2 | 9/2012 | Fujishima et al. |
| 8,592,232 B2 | 11/2013 | Suh et al. |
| 9,521,795 B2 | 12/2016 | Hsiao et al. |
| 10,083,939 B2 | 9/2018 | Seo et al. |
| 10,157,813 B2 | 12/2018 | Hung et al. |
| 2008/0088031 A1 | 4/2008 | Kwon et al. |
| 2013/0119528 A1 | 5/2013 | Groothuis et al. |
| 2015/0102468 A1* | 4/2015 | Kang ..................... H01L 24/94 |
| | | 257/621 |
| 2018/0012868 A1 | 1/2018 | Huang et al. |
| 2018/0068938 A1 | 3/2018 | Yazdani |
| 2019/0237430 A1 | 8/2019 | England |
| 2021/0159178 A1 | 5/2021 | Nam et al. |

OTHER PUBLICATIONS

Office Action dated Sep. 2, 2021 in corresponding U.S. Appl. No. 16/994,139.

* cited by examiner

SEMICONDUCTOR PACKAGE

CROSS-REFERENCE TO RELATED APPLICATION(S)

This U.S. non-provisional patent application is a continuation application of U.S. patent application Ser. No. 16/994,139 filed Aug. 14, 2020 now U.S. Pat. No. 11,393,764, which claims benefit of priority under 35 U.S.C. 119(a) to Korean Patent Application No. 10-2019-0153981 filed on Nov. 27, 2019 in the Korean Intellectual Property Office, the disclosure of which is incorporated by reference in its entirety herein.

BACKGROUND

1. Technical Field

The present disclosure relates to a semiconductor package.

2. Discussion of Related Art

Electronic devices continue to become smaller and lighter due to rapid advances in the electronics industry and user demand. A semiconductor package is a casing containing one or more discrete semiconductor devices or integrated circuits. However, semiconductor packages used in the electronic devices not only need to be miniaturized and lightened, but also need to be highly efficient and to have a higher capacity. To this end, continuous research and development has been conducted into semiconductor chips including through-silicon vias (TSVs) and stacked semiconductor packages. However, a stacked semiconductor package may have difficulty dissipating heat, which can lead to a device failure.

SUMMARY

At least one example embodiment of the inventive concept provides a semiconductor package having improved heat dissipation characteristics and which can be manufactured more easily to improve manufacturing productivity.

According to an example embodiment of the inventive concept, a semiconductor package includes: a base chip; a first semiconductor chip disposed on the base chip; a second semiconductor chip disposed on the first semiconductor chip; a first insulating layer disposed between the base chip and the first semiconductor chip; a second insulating layer disposed between the first semiconductor chip and the second semiconductor chip; a first connection bump penetrating through the first insulating layer and connecting the base chip and the first semiconductor chip to each other; and a second connection bump penetrating through the second insulating layer and connecting the first semiconductor chip and the second semiconductor chip to each other. The base chip has a width greater than a width of each of the first and second semiconductor chips. The first insulating layer and the second insulating layer include different materials from each other.

According to an example embodiment of the inventive concept, a semiconductor package includes a base chip; a first semiconductor chip; a plurality of second semiconductor chips stacked on the first semiconductor chip in a direction perpendicular to an upper surface of the first semiconductor chip; a first insulating layer between the base chip and the first semiconductor chip; a plurality of second insulating layers on a lower surface of each of the plurality of second semiconductor chips; a first connection bump penetrating through the first insulating layer and electrically connecting the base chip and the first semiconductor chip to each other; and a plurality of second connection bumps, respectively penetrating through the plurality of second insulating layers, and electrically connecting the first semiconductor chip and the plurality of second semiconductor chips to each other. The first insulating layer has the same width as the first semiconductor chip. Each of the plurality of second insulating layers has a width greater than the width of the first semiconductor chip. The first insulating layer and the second insulating layer include different materials from each other.

According to an example embodiment of the inventive concept, a semiconductor package includes: a base chip including a base body, a base upper connection pad disposed on an upper surface of the base body, and a base through-electrode penetrating through the base body and connected to the base upper connection pad; a plurality of semiconductor chips, disposed on the base chip, each including a first chip body, a first lower connection pad and a first upper connection pad, respectively disposed on a lower surface and an upper surface of the first chip body, and a first through-electrode penetrating through the first chip body and connecting the first lower connection pad and the first upper connection pad to each other, the plurality of semiconductor chips being stacked in a direction perpendicular to an upper surface of the base chip; a plurality of second semiconductor chips, disposed on the plurality of first semiconductor chips, each including a second chip body, a second lower connection pad and a second upper connection pad, respectively disposed on a lower surface and an upper surface of the second chip body, and a second through-electrode penetrating through the second chip body and connecting the second lower connection pad and the second upper connection pad to each other, the plurality of second semiconductor chips being stacked in a direction perpendicular to an upper surface of the first semiconductor chip; a plurality of first insulating layers disposed on a lower surface of each of the plurality of first semiconductor chips; a plurality of second insulating layers disposed on a lower surface of each of the plurality of second semiconductor chips; a plurality of first connection bumps, respectively penetrating through the plurality of first insulating layers, and connecting the first lower connection pad to the base upper connection pad or the first upper connection pad; and a plurality of second connection bumps, respectively penetrating through the plurality of second insulating layers, and connecting the second lower connection pad to the first upper connection pad or the second upper connection pad. The number of the plurality of first semiconductor chips is smaller than the number of the plurality of second semiconductor chips. The base chip has a width greater than a width of each of the plurality of first semiconductor chips and a width of each of the plurality of second semiconductor chips. The plurality of first insulating layers and the plurality of second insulating layers include different materials from each other.

BRIEF DESCRIPTION OF DRAWINGS

The present disclosure will be more clearly understood from the following detailed description, taken in conjunction with the accompanying drawings.

DETAILED DESCRIPTION OF THE EXAMPLE EMBODIMENTS

Hereinafter, example embodiments of the inventive concept will be described with reference to the accompanying drawings.

Figure 1:
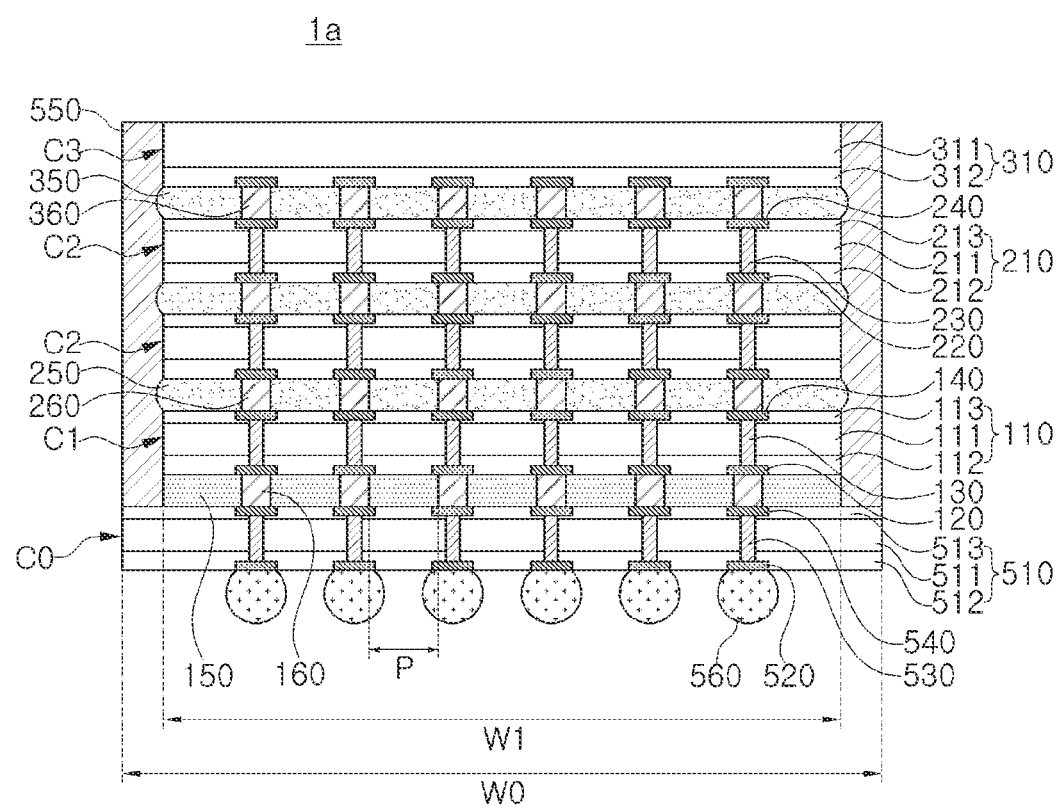
FIG. 1 is a cross-sectional view of a semiconductor package according to an example embodiment of the inventive concept.

FIG. 1 is a cross-sectional view of a semiconductor package according to an example embodiment of the inventive concept.

Referring to FIG. 1, a semiconductor package 1a according to an example embodiment includes a base chip C0, a first semiconductor chip C1, a second semiconductor chip C2 (or multiple second semiconductor chips C2), and a third semiconductor chip C3. A first insulating layer 150 is disposed between the base chip C0 and the first semiconductor chip C1. The first insulating layer 150 includes first connection bumps 160. A second insulating layer 250 is disposed between the first semiconductor chip C1 and a second semiconductor chip C2. The second insulating layer 250 includes second connection bumps 260. A third insulating layer 350 is disposed between a second semiconductor chip C2 and the third semiconductor chip C3. The third insulating layer 350 includes a third connection bumps 360. When two second semiconductor chips C2 are present, an additional insulating layer (e.g., 250 or 350) is located between the two semiconductor chips C2. For example, one semiconductor chip C2 may be disposed between the first semiconductor chip C1 and another semiconductor chip C2, and the other semiconductor chip C2 may be disposed between the one semiconductor chip C2 and the third semiconductor chip C3.

In an example embodiment, the base chip C0 has a width W0 greater than a width W1 of each of the first and second semiconductor chips C1 and C2. In an example embodiment, the first insulating layer 150 includes a first material different from a material of the second insulating layer 250 and the third insulating layer 350, and the second and third insulating layer 250 and 350 include the a same second material. In an example embodiment, first insulating layer 150 is entirely made of the first material and the second and third insulating layers 250 and 350 are entirely made of the second material.

The base chip C0 includes a base body 510, a base lower connection pad 520 and base upper connection pads 540, respectively disposed on the lower and upper surfaces of the base body 510, and a base through-electrode 530 penetrating through the base body 510 and connecting the base lower connection pad 520 and the base upper connection pad 540 to each other. One or more base connection bumps 560 may be mounted on a lower surface of the base chip C0. For example, the base connection bump 560 may be disposed on each base lower connection pad 520 disposed on a lower surface of the base chip C0. The base body 510 includes a base substrate 511, an interlayer dielectric 512, and a rear passivation layer 513.

Unlike the first to third semiconductor chips C1, C2, and C3, the base chip C0 may be a dummy semiconductor chip which does not include individual elements. The base chip C0 may be a buffer chip receiving at least one of a control signal, a power signal, and a ground signal for operating the first to third semiconductor chips C1, C2, and C3. The base chip C0 may receive these signals from an external device through the base through-electrode 530 and the interlayer dielectric 512. The base chip C0 may also receive a data signal from an external device that is to be stored in the first to third semiconductor chips C1, C2, and C3. The base chip C0 may also provide the data stored in the first to third semiconductor chips C1, C2, and C3 to an external device.

The first to third semiconductor chips C1, C2, and C3 may be stacked on the base chip C0. In an example embodiment, side surfaces of the stacked first to third semiconductor chips C1, C2, and C3 are surrounded by an encapsulant 550 and are not exposed outwardly from the semiconductor package 1a. Thus, damage to the semiconductor chips C1, C2, and C3 may be prevented during movement or storage of the semiconductor package 1a.

As discussed above, the base body 510 may include a base substrate 511, an interlayer dielectric 512, and a rear passivation layer 513. The base substrate 511 may include, for example, silicon. A plurality of wiring structures may be formed in the interlayer dielectric 512, and may be electrically connected to the base through-electrode 530. The rear passivation layer 513 may include, for example, an insulating polymer and may be formed by a spin coating process or a spray process.

The base lower connection pad 520 and the base upper connection pad 540 may be disposed on a lower surface and an upper surface of the base body 510, respectively, and may be electrically connected to a wiring structure in the interlayer dielectric 512 or may be directly connected to the base through-electrode 530. The base lower connection pad 520 and the base upper connection pad 540 may include at least one of aluminum, copper, nickel, tungsten, platinum, and gold.

The base through-electrode 530 may extend from the upper surface to the lower surface of the base body 510 through the base body 510. The base through-electrode 530 may be directly connected to the base lower connection pad 520 and the base upper connection pad 540 through the interlayer dielectric 512. The base through-electrode 530 may be electrically connected to the wiring structure in the interlayer dielectric 512.

Figure 4:
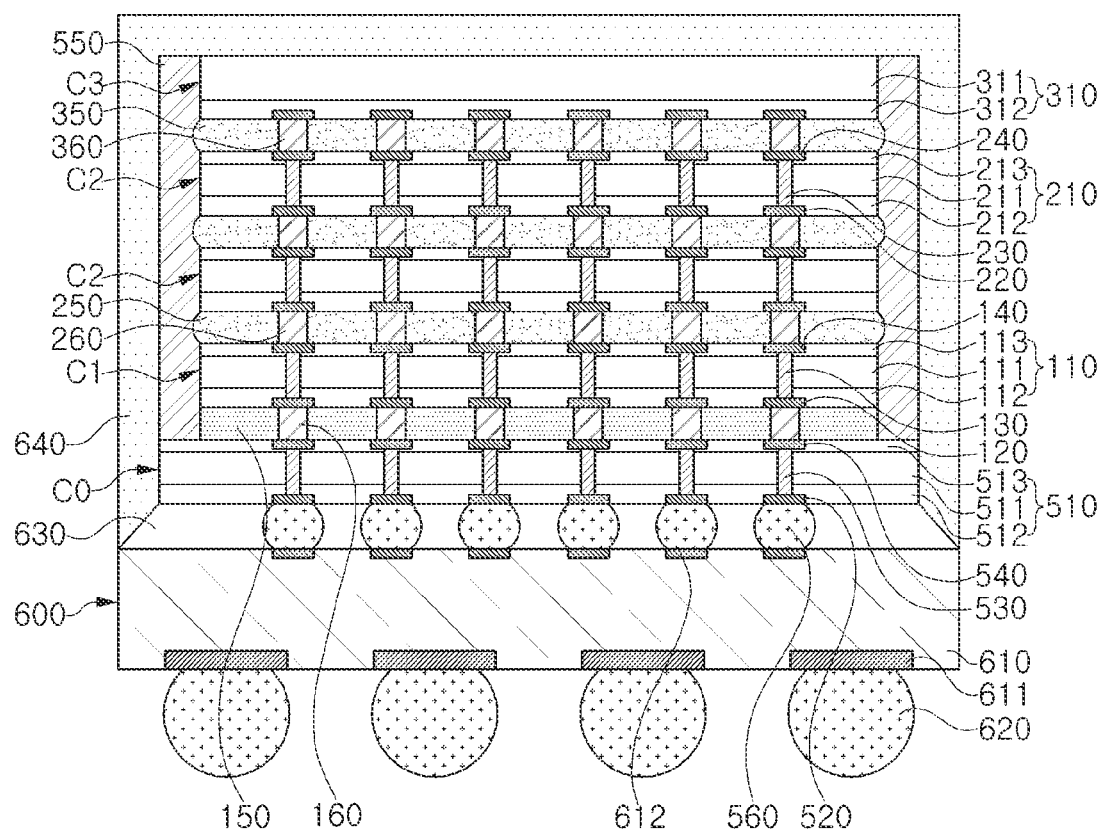
FIG. 4 is a cross-sectional view of a semiconductor package according to an example embodiment of the inventive concept.

The base connection bump 560 may be used to electrically connect the semiconductor package 1a to an external base substrate (for example, 600 of FIG. 4). The base connection bump 560 may receive at least one of a control signal, a power signal, and a ground signal for operating the first to third semiconductor chips C1, C2, and C3 from an external device, or may receive a data signal to be stored in the first to third semiconductor chips C1, C2, and C3 from an external device, or may provide data stored in the first to third semiconductor chips C1, C2, and C3 to an external device. In an example embodiment, the base connection bump 560 includes a conductive material. However, the material of the base connection bump 560 is not limited to a specific material. The base connection bump 560 may be a land, a line, a ball, or a pin. The base connection bump 560 may be formed as a multilayer structure or a single-layer structure. When the base connection bump 560 is formed as a multilayer structure, the base connection bump 560 may include a copper pillar and a solder. When the base connection bump 560 is formed as a single-layer structure, the base connection bump 560 may include a tin-silver solder or copper. However, these are merely examples and the base connection bump 560 is not limited thereto. The number, an interval (e.g., spacing between them), and locations of the base connection bumps 560 are not limited to any particular arrangement, and may be variously modified.

In an example embodiment of the inventive concept, the base chip C0 has a horizontal width W0 greater than a horizontal width W1 of each of the first to third semiconductor chips C1, C2, and C3, and the first to third semiconductor chips C1, C2, and C3 have the same or substantially the same horizontal width W1. Such a structural feature may result when the first to third semiconductor chips C1, C2, and C3 are sequentially stacked on the base chip C0 in a wafer state and the base chip C0 in the wafer state is cut into individual chips. Thus, the encapsulant 550 may cover an upper surface of the base chip C0 and side surfaces of each of the first to third semiconductor chips C1, C2, and C3. In an example embodiment, a side surface of the encapsulant 550 is substantially coplanar with a side surface of the base chip C0. In an example embodiment, the base chip C0 does not extend past the encapsulant 550.

The first to third semiconductor chips C1, C2, and C3 may be sequentially stacked on the base chip C0. The base chip C0 and the first to third semiconductor chips C1, C2, and C3 may be attached to each other by the first to third insulating layers 150, 250, and 350. The base chip C0 and the first to third semiconductor chips C1, C2, and C3 may be electrically connected to each other through first to third connection bumps 160, 260, and 360. The first to third connection bumps 160, 260, and 360 may include a conductive material.

The first to third semiconductor chips C1, C2, and C3 may be logic chips or memory chips. For example, all of the first to third semiconductor chips C1, C2, and C3 may be the same type of memory chips, or a portion of the first to third semiconductor chips C1, C2, and C3 may be memory chips, and another portion thereof may be logic chips. In an example embodiment of the inventive concept, horizontal widths W1 of the first to third semiconductor chips C1, C2, and C3 are the same or substantially the same.

The memory chip may be, for example, a volatile memory chip such as a dynamic random access memory (DRAM) or a static random access memory (SRAM), or a nonvolatile memory chip such as a phase-change random access memory (PRAM), a magnetoresistive random access memory (MRAM), a ferroelectric random access memory (FeRAM), or a resistive random access memory (RRAM). In an example embodiment of the inventive concept, each of the semiconductor chips C1, C2, and C3 is a high-bandwidth memory (HBM) DRAM. In addition, the logic chip may be, for example, a microprocessor, an analog device, a digital signal processor, a field programmable gate array, etc.

A semiconductor package 1a, in which a single first semiconductor chip C1, two second semiconductor chips C2, and a single third semiconductor chip C3 are stacked, is illustrated as an example in FIG. 1. However, the number of semiconductor chips, stacked on the base chip C0, is not limited thereto. For example, two, four, eight, or more than 16 semiconductor chips may be stacked on the base chip C0.

The first semiconductor chip C1 is disposed on the base chip C0, and includes a first chip body 110, a first lower connection pad 120 and a first upper connection pad 140. The first lower connection pad 120 is disposed on a lower surface of the first chip body 110 and the first upper connection pad 140 is disposed on an upper surface of the first chip body 110. A first through-electrode 130 penetrates through the first chip body 110 and connects the first lower connection pad 120 and the first upper connection pad 140 to each other. A first insulating layer 150 and a first connection bump 160 may be disposed between the first semiconductor chip C1 and the base chip C0. The first semiconductor chip C1 may be electrically connected to the base chip C0 through the first connection bump 160.

The first chip body 110 includes a first semiconductor substrate 111, a first semiconductor device layer 112, and a first rear passivation layer 113. The first semiconductor substrate 111 may have upper and lower surfaces opposing each other. The first semiconductor device layer 112 may be disposed on a side of the lower surface of the first semiconductor substrate 111. The first through-electrode 130 may extend from an upper surface of the first semiconductor substrate 111 toward a lower surface of the first semiconductor substrate 111 through the first semiconductor substrate 111, and may be connected to a first wiring structure (not illustrated) provided in the first semiconductor device layer 112 or may be directly connected to the first lower connection pad 120 through the first semiconductor device layer 112. For example, unlike what is illustrated in FIG. 1, the first lower connection pad 120 disposed on the first semiconductor device layer 112 may be electrically connected to the first through-electrode 130 through a first wiring structure in the first semiconductor device layer 112.

The first semiconductor substrate 111 may include, for example, silicon. Alternatively, the first semiconductor substrate 111 may include a semiconductor element such as germanium or a compound semiconductor such as silicon carbide (SiC), gallium arsenide (GaAs), indium arsenide (InAs), and indium phosphide (InP). Alternatively, the first semiconductor substrate 111 may have a silicon-on-insulator (SOI) structure. For example, the first semiconductor substrate 111 may include a buried oxide layer. The first semiconductor substrate 111 may have a conductive region, for example, a well doped with impurities or a structure doped with impurities. In addition, the first semiconductor substrate 111 may have various isolation structures such as a shallow trench isolation (STI) structure.

The first semiconductor device layer 112 may be formed to include a first wiring structure (not illustrated) for connecting a plurality of individual elements to other wirings formed in the first semiconductor substrate 111. The first wiring structure (not illustrated) may include a metal wiring layer and a via plug.

The rear passivation layer 113 may include an insulating material. For example, the rear passivation layer 113 may include an insulating polymer and may be formed by a spin coating process or a spray process. Alternatively, the rear passivation layer 113 may include, for example, a silicon oxide and may be formed by a common oxide deposition method.

The first lower connection pad 120 and the first upper connection pad 140 may be disposed on the lower surface and the upper surface of the first chip body 110, respectively. The first lower connection pad 120 may be disposed on the first semiconductor device layer 112, and may be electrically connected to the first wiring structure in the first semiconductor device layer 112, or may be directly connected to the first through-electrode 130. The first lower connection pad 120 may include at least one of aluminum, copper, nickel, tungsten, platinum, and gold. The first upper connection pad 140 may be disposed on the upper surface of the first semiconductor substrate 111 and may be electrically connected to the first through-electrode 130. The first upper connection pad 140 may include the same material as the first lower connection pad 120. In addition, the first rear passivation layer 113 may be disposed on the upper surface of the first semiconductor substrate 111 to cover the upper surface of the first semiconductor substrate 111 and to surround a portion of a side surface of the first through-electrode 130.

In an example embodiment, a lower surface of the first lower connection pad 120 is coplanar or substantially coplanar with the lower surface of the first chip body 110. Accordingly, the first lower connection pad 120 may be embedded in the first semiconductor device layer 112. However, embodiments of the semiconductor package 1a are not limited thereto. For example, unlike what is illustrated in FIG. 1, the first lower connection pad 120 may protrude further than a lower surface of the first semiconductor device layer 112. Although not illustrated in FIG. 1, a first lower passivation layer may be provided on the first semiconductor device layer 112 to protect the first wiring structure in the first semiconductor device layer 112 and other structures disposed therebelow from external impact or moisture. For example, the first lower passivation layer may expose at least a portion of a surface of the first lower connection pad 120.

In an example embodiment, an upper surface of the first upper connection pad 140 coplanar or substantially coplanar with the upper surface of the first chip body 110. Accordingly, the first upper connection pad 140 may be embedded in the first rear passivation layer 113. However, embodiments of the semiconductor package 1a are not limited thereto and. For example, unlike what is illustrated in FIG. 1, the first upper connection pad 140 may further protrude than an upper surface of the first rear passivation layer 113.

When the lower surface of the first lower connection pad 120 is substantially coplanar with the lower surface of the first chip body 110 and the upper surface of the first upper connection pad 140 is substantially coplanar with the upper surface of the first chip body 110, the overall height of the stacked semiconductor chips may be reduced. Accordingly, adhesion between the first insulating layer 150 and the first semiconductor chip C1 or adhesion between the second insulating layer 250 and the first semiconductor chip C1 may be improved.

The first through-electrode 130 may extend from an upper surface of the first semiconductor substrate 111 toward the lower surface of the first semiconductor substrate 111 and may extend inwardly of the first semiconductor device layer 112. At least a portion of the first through-electrode 130 may have a pillar shape.

The second semiconductor chip C2 may be mounted or disposed on the first semiconductor chip C1. The second semiconductor chip C2 includes a second chip body 210, a second lower connection pad 220 and a second upper connection pad 240, respectively disposed on a lower surface and an upper surface of the second chip body 210. The second semiconductor chip C2 further includes a second through-electrode 230 penetrating through the second chip body 210 and connecting the second lower connection pad 220 and the second upper connection pad 240 to each other. The second insulating layer 250 and the second connection bump 260 are disposed between the second semiconductor chip C2 and the first semiconductor chip C1. The second semiconductor chip C2 may be electrically connected to the first semiconductor chip C1 through the second connection bump 260.

For example, the second semiconductor chip C2 may be stacked in a direction perpendicular to the upper surface of the first semiconductor chip C1. A plurality of the second semiconductor chips C2 may be present, each including a second lower connection pad 220 and a second upper connection pad 240, respectively disposed on the lower surface and the upper surface of the second chip body, and a second through-electrode 230 connecting the lower connection pad 220 and the second upper connection pad 240 to each other. For example, the number of the second semiconductor chips C2, included in the semiconductor package 1a, may be greater than the number of the first semiconductor chips C1.

The third semiconductor chip C3 may be mounted or disposed on the second semiconductor chip C2. The third semiconductor chip C3 includes a third chip body 310 and a third lower connection pad 320 disposed on a lower surface of the third chip body 310. In an example embodiment, the third semiconductor chip C3 does not include a through-electrode. For example, a through-electrode like the first through-electrode 130 does not pass through the third semiconductor chip C3. A third insulating layer 350 and a third connection bump 360 are disposed between the third semiconductor chip C3 and the second semiconductor chip C2. The third semiconductor chip C3 may be electrically connected to the second semiconductor chip C2 through the third connection bump 360.

Since the second to third semiconductor chips C2 and C3 may have the same or similar technical characteristics as the first semiconductor chip C1, detailed descriptions of the second to third semiconductor chips C2 and C3 will be omitted.

The first to third insulating layers 150, 250, and 350 may be disposed below the first to third semiconductor chips C1, C2, and C3, respectively. The first insulating layer 150 may be disposed between the base chip C0 and the first semiconductor chip C1. The second insulating layer 250 may be disposed between the first semiconductor chip C1 and the second semiconductor chip C2. The third insulating layer 350 may be disposed between the second semiconductor chip C2 and the third semiconductor chip C3. When a plurality of second semiconductor chips C2 are stacked in a direction perpendicular to an upper surface of the first semiconductor chip C1, a plurality of second insulating layers 250 may be present, respectively disposed on lower surfaces of the second semiconductor chips C2.

According to an example embodiment of the inventive concept, the first insulating layer 150, disposed to be relatively adjacent to the base chip C0, includes a material different from a material of the second insulating layer 250 and the third insulating layer 350, disposed to be relatively distant from the base chip C0. Thus, a heat dissipation effect through the first semiconductor chip C1 may be improved. Further, productivity of a bonding process for bonding the second semiconductor chip C2 and the third semiconductor chip C3 may be maintained at a constant level.

In an example embodiment, the first insulating layer 150 includes silicon oxide. The silicon oxide may have better heat dissipation performance than a non-conductive film (NCF) or a non-conductive paste (NCP), a polymer-based insulating layer, and may reduce a gap between semiconductor chips. Accordingly, when the silicon oxide is formed between the base chip C0 and the first semiconductor chip C1 disposed to be adjacent to a device that generates a large amount (for example, a mainboard or a logic chip), heat dissipation characteristics of a semiconductor package may be improved. The silicon oxide may be formed by an oxide deposition method. Thus, a side surface of the first insulating layer 150 may be coplanar or substantially coplanar with a side surface of the first semiconductor chip C1. In an example embodiment, the first insulating layer 150 has substantially the same width as the first semiconductor chip C1.

In an example embodiment, the second insulating layer 250 and the third insulating layer 350 include a non-conductive film (NCF). In an example embodiment, the non-conductive film (NCF) include an adhesive resin. The adhesive resin may serve to bond the second insulating layer 250 and the third insulating layer 350 to semiconductor chips. The adhesive resin may be a thermosetting resin and may include at least one of, for example, a bisphenol type epoxy resin, a novolac type epoxy resin, a phenol resin, a urea resin, a melamine resin, an unsaturated polyester resin, and a resorcinol resin. In a process of bonding between semiconductor chips, using a non-conductive film as an insulating layer has better productivity than using the silicon oxide as an insulating layer. For example, semiconductor chips can be bonded together more quickly during a bonding process that uses the non-conductive film rather than the silicon oxide. Accordingly, when the non-conductive film is formed between the second and third semiconductor chips C2 and C3 disposed to be relatively distant from a device that generates a large amount of heat (for example, a mainboard or a logic chip), manufacturing productivity may be maintained at a constant level. The non-conductive film may be formed below the second and third semiconductor chips C2 and C3, and may bond the second and third semiconductor chips C2 and C3 using a thermal compression process. Therefore, in an example embodiment of the inventive concept, a side surface of the second insulating layer 250 protrudes further outwardly than the side surfaces of the first semiconductor chip C1 and the second and third semiconductor chips C2 and C3. In an example embodiment, the second insulating layer 250 has a width greater than a width of the second semiconductor chip C2.

The first to third connection bumps 160, 260, and 360 may penetrate through the first to third insulating layers 150, 250, and 350 to electrically connect the base chip C0 to the first to third semiconductor chips C1, C2, and C3. The first connection bump 160 may penetrate through the first insulating layer 150 to connect the first lower connection pad 120 to the base upper connection pad 540. The second connection bump 260 may penetrate through the second insulating layer 250 to connect the second lower connection pad 220 to the first upper connection pad 140. The third connection bump 360 may penetrate through the third insulating layer 350 to connect the third lower connection pad 320 to the second upper connection pad 240. For example, as illustrated in FIG. 1, when a plurality of second semiconductor chips C2 are stacked in a direction perpendicular to the upper surface of the first semiconductor chip C1, the second connection bumps 260 may penetrate through the second insulating layer 250 to connect the second lower connection pad 220 to the first upper connection pad 140 or the second upper connection pad 240.

In an example embodiment of the inventive concept, the first to third connection bumps 160, 260, and 360 may have the same shape. However, the shapes of the connection bumps 160, 260, and 360 are not limited thereto and may have different shapes in alternate embodiments. For example, the first connection bumps 160, the second connection bumps 260, and the third connection bumps 360 may have a conductive pillar shape. In an example embodiment of the inventive concept, a pitch P (or spacing) between a plurality of connection bumps 160, respectively corresponding to the plurality of base upper connection pads spaced apart from each other and the plurality of base upper connection pads spaced apart from each other, is 10 µm or less. When the first to third connection bumps 160, 260, and 360 have a copper pillar shape, a pitch P between connection bumps may be reduced because the first to third connection bumps 160, 260, and 360 do not spread during thermal compression, unlike solder balls.

Since the first to third connection bumps 160, 260 and 360 may have the same or similar technical features as the base connection bumps 560, duplicate descriptions thereof will be omitted.

The semiconductor package 1a may further include an encapsulant 550 covering the base chip C0 and the first to third semiconductor chips C1, C2, and C3. The encapsulant 550 may cover an upper surface of the base chip C0 and side surfaces of each of the first semiconductor chip C1, the second semiconductor chip C2, and the third semiconductor chip C3. In an example embodiment of the inventive concept, an upper surface of the third semiconductor chip C3 is exposed from the encapsulant 550. However embodiments of the inventive concept are not limited to this type of exposure. The encapsulant 550 may extend to the upper surface of the third semiconductor chip C3. For example, the encapsulant 550 may extend to completely encapsulate the third semiconductor chip C3 or to encapsulate portions of the upper surface of the third semiconductor chip C3 so that other portions of the upper surface are exposed. For example, the encapsulant 550 may include an epoxy mold compound (EMC).

Figure 2:
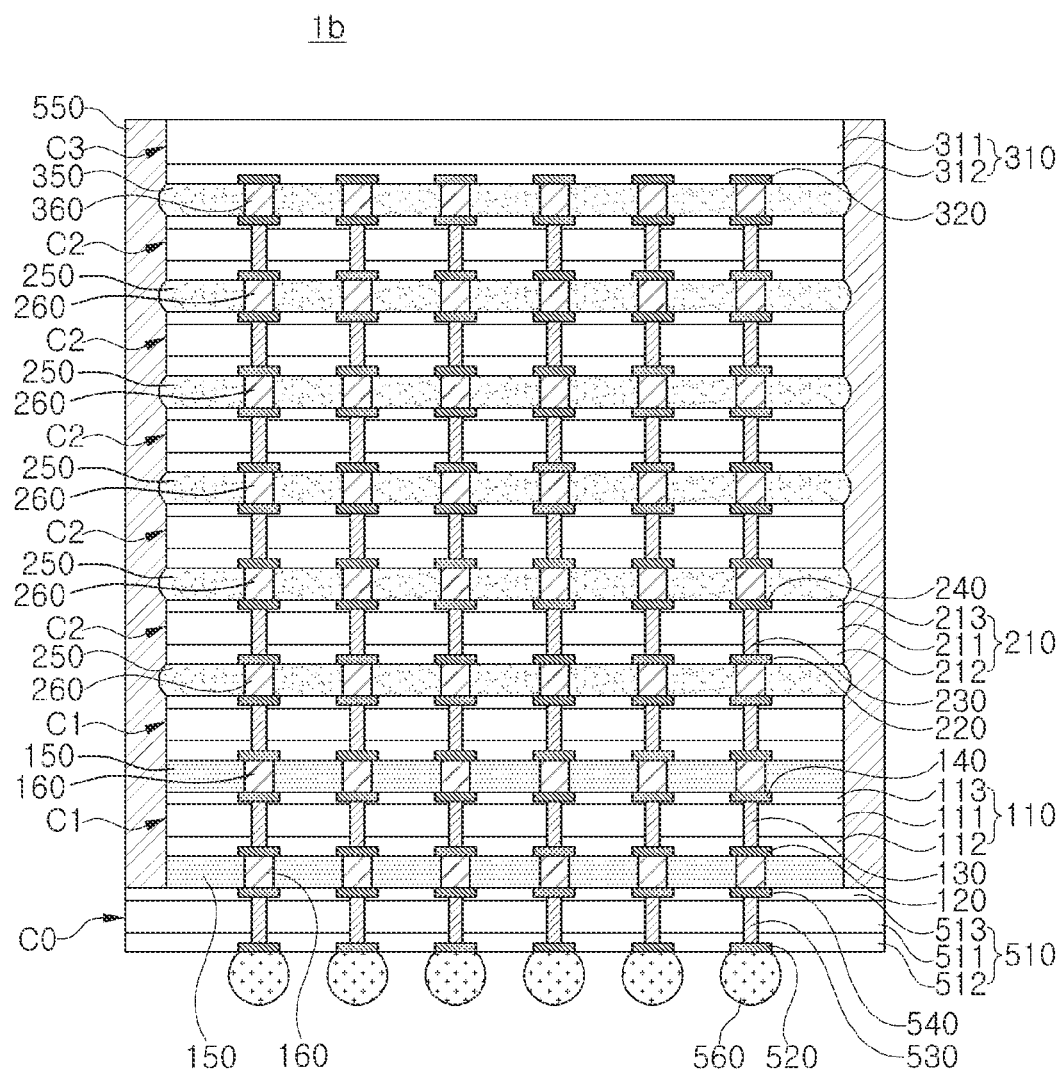
FIG. 2 is a cross-sectional view of a semiconductor package according to an example embodiment of the inventive concept.

FIG. 2 is a cross-sectional view of a semiconductor package 1b according to an example embodiment of the inventive concept.

Referring to FIG. 2, the semiconductor package 1b includes a plurality of first semiconductor chips C1 and a plurality of second semiconductor chips C2. Each of the plurality of first semiconductor chips C1 includes a first chip body 110, a first lower connection pad 120 and a first upper connection pad, respectively disposed on a lower surface and an upper surface of the first chip body 110, and the first chip body 110, respectively. Each of the plurality of first semiconductor chips C1 includes a first through-electrode 130 penetrating through the first chip body 110 and connecting the first lower connection pad 120 and the first upper connection pad 140 to each other. The plurality of first semiconductor chip C1 may be stacked in a direction perpendicular to an upper surface of the base chip C0.

The plurality of second semiconductor chips C2 are disposed on an uppermost first semiconductor chip C1 among the plurality of first semiconductor chips C1. Each of the plurality of second semiconductor chips C2 includes a second chip body 210, a second lower connection pad 220 and a second upper connection pad 240, respectively disposed on a lower surface and an upper surface of the second chip body 210. Each of the plurality of second semiconductor chips C2 includes a second through-electrode 230 penetrating through the second chip body 210 and connecting the second lower connection pad 220 and the second upper connection pad 240 to each other. The plurality of second semiconductor chips C2 may be stacked in a direction perpendicular to the upper surface of the first semiconductor chip C1.

Since the plurality of first semiconductor chips C1 are disposed to be relatively adjacent to the base chip C0 disposed to be adjacent to a device generating a large amount of heat (for example, a mainboard or a logic chip), a plurality of first insulating layers 150, respectively disposed on (or between) lower surfaces of the plurality of first semiconductor chips C1, and a plurality of second insulating layers 250, respectively disposed on (or between) lower surfaces of the plurality of second semiconductor chips C2, include different materials from each other. For example, the plurality of insulating layers 150 are made from a first material and the plurality of second insulating layers 250 are made from a second material of a different type. Therefore, a manufacturing productivity of the semiconductor package 1b, in which the plurality of second semiconductor chips C2 are stacked, may be maintained at a constant level while improving a heat dissipation effect through the plurality of first semiconductor chips C1. In an example embodiment of the inventive concept, the number of the plurality of first semiconductor chips C1 is smaller than the number of the plurality of second semiconductor chips C2 to maintain heat dissipation characteristics and to improve a manufacturing productivity of the package 1b.

The plurality of first insulating layers 150 may include an insulating layer, disposed between the base chip C0 and the first semiconductor chip C1, and one or more insulating layers disposed between the plurality of first semiconductor chips C1. The plurality of second insulating layers 250 may include an insulating layer, disposed between the first semiconductor chip C1 and the second semiconductor chip C2, and one or more insulating layers disposed between the plurality of second semiconductor chips C2.

Although the semiconductor package 1b, in which two first semiconductor chips C1, five second semiconductor chips C2, and one third semiconductor chip C3 are stacked on the base chip C0, is illustrated as an example, the number of semiconductor chips stacked on the base chip C0 is not limited thereto. For example, eight semiconductor chips or sixteen or more semiconductor chips may be stacked on the base chip C0.

A single first connection bump 160 may be present or a plurality of first connection bumps 160 may be present. The plurality of first connection bumps 160 respectively penetrate through the plurality of first insulating layers 150, and connect the first lower connection pad 120 to a base upper connection pad 540 or a first upper connection pad 140.

For example, the first connection bump 160 may include a connection bump, disposed between the base chip C0 and the first semiconductor chip C1 and connecting the first lower connection pad 120 to the base upper connection pad 540, and one or more connection bumps disposed between the plurality of first semiconductor chips C1 and connecting the first lower connection pad 120 and the first upper connection pad 140 to each other.

For example, the second connection bumps 260 may include a connection bump, disposed between an uppermost first semiconductor chip C1 among the plurality of first semiconductor chips C1 and a lowermost semiconductor chip C2 among the plurality of second semiconductor chips C2 and connecting the second lower connection pad 220 to the first upper connection pad 140 of the uppermost first semiconductor chip C1, and one or more connection bumps disposed between the plurality of second semiconductor chips C2 and connecting a second lower connection pad 220 and a second upper connection pad 240 of each of the plurality of second semiconductor chips C2 to each other.

In FIG. 2, elements designated by the same reference numerals as those in FIG. 1 designate similar elements in FIG. 1 and descriptions thereof will be omitted.

Figure 3:
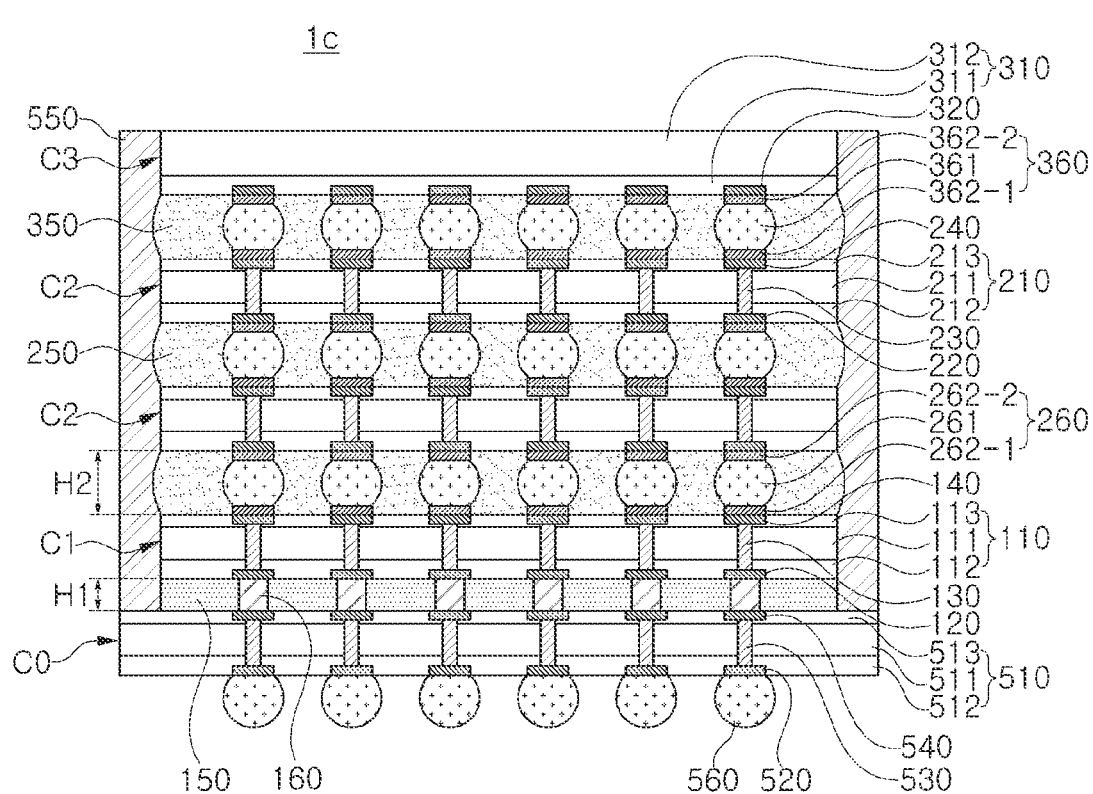
FIG. 3 is a cross-sectional view of a semiconductor package according to an example embodiment of the inventive concept.

FIG. 3 is a cross-sectional view of a semiconductor package 1c according to an example embodiment of the inventive concept.

Referring to FIG. 3, the semiconductor package 1c includes a first connection bump 160 and a second connection bump 260 having different shapes from each other. For example, the first connection bumps 160 may include copper pillars, and the second connection bumps 260 may include solder balls. In an example embodiment, the second connection bump 260 has a combination form of a copper pillar and a solder ball. For example, a second lower connection pillar 262-1 and a second upper connection pillar 262-2 may be disposed on a first upper connection pad 140 of a first semiconductor chip C1 and a second lower connection pad 220 of a second semiconductor chip C2, respectively, and a second solder ball 261 may be disposed between the second lower connection pillar 262-1 and the second upper connection pillar 262-2. Similarly, a third lower connection pillar 362-1 and a third upper connection pillar 362-2 may be disposed on a second upper connection pad 240 of a second semiconductor chip C2 and a third lower connection pad 320 of a third semiconductor chip C3, respectively, and a third solder ball 361 may be disposed between the third lower connection pillar 362-1 and the third upper connection pillar 362-2.

In an example embodiment of the inventive concept, a height H1 between an upper surface of a base chip C0 and a lower surface of the first semiconductor chip C1 with the first connection bump 160 interposed therebetween is less than a height H2 between an upper surface of the first semiconductor chip C1 and a lower surface of the second semiconductor chip C2 with the second connection bump 260 interposed therebetween.

In FIG. 3, elements designated by the same reference numerals as those in FIG. 1 designate similar elements in FIG. 1 and descriptions thereof will be omitted.

FIG. 4 is a cross-sectional view of a semiconductor package 2a according to an example embodiment of the inventive concept.

Referring to FIG. 4, the semiconductor package 2a includes a base substrate 600, and a base chip C0 and first to third semiconductor chips C1, C2, and C3 mounted on the base substrate 600 and sequentially stacked on an upper surface of the base substrate 600.

The base substrate 600 may be, for example, a printed circuit board, a ceramic substrate, or an interposer. When the base substrate 600 is a printed circuit board, the base substrate 600 may include a substrate body portion 610, a lower pad 611, and an upper pad 612. The pads 611 and 612 may include a conductive material. As necessary, the base substrate 600 may include solder resist layers disposed on a lower surface and an upper surface of the substrate body portion 610. An internal wiring may be disposed in the substrate body portion 610 to electrically connect the lower pad 611 and the upper pad 612 to each other. The lower surface pad 611 and the upper surface pad 612 may be portions exposed by the solder resist layers disposed on the lower surface and the upper surface of the substrate body portion 610 among the circuit wirings patterned after coating a copper (Cu) foil on the lower surface and the upper surface of the substrate body portion 610, respectively.

When the base substrate 600 is an interposer, the base substrate 600 may include a substrate body 610, formed of a semiconductor material, and a lower surface pad 611 and an upper surface pad 612, respectively disposed on a lower surface and an upper surface of the substrate body portion 610. The substrate body portion 610 may be formed from, for example, a silicon wafer. In addition, an internal wiring may be formed on the lower surface, the upper surface, or inside of the substrate body portion 610. In addition, a through-via may be formed in the substrate body portion 610 to electrically connect the lower pad 611 and the upper pad 612.

An external connection terminal 620 may be attached to the lower surface of the base substrate 600. The external connection terminal 620 may be attached onto, for example, the lower pad 611. The external connection terminal 620 may be, for example, a solder ball or a bump. The external connection terminal 620 may electrically connect the semiconductor package 2b to an external device. Unlike what is illustrated in FIG. 4, at least a portion of the external connection terminals 620 may be disposed in a region, not overlapping the base chip C0 and the first to third semiconductor chips C1, C2, and C3 in a vertical direction. For example, an external connection terminal 620 could be located on another substrate or board, and then a wire could connect this terminal to pad 610.

In an example embodiment of the inventive concept, a molding member 640 is disposed on the base substrate 600 to cover the base chip C0 and the first to third semiconductor chips C1, C2, and C3 and an encapsulant 550 surrounding at least side surfaces of the first to third semiconductor chips C1, C2, and C3. In an example embodiment, the molding member 640 is not in direct contact with the side surfaces of the first to third semiconductor chips C1, C2, and C3. The molding member 640 may be formed of, for example, an epoxy mold compound (e.g., a thermosetting plastic).

An underfill material layer 630 may be formed between the base substrate 600 and the base chip C0. The underfill material layer 630 may be interposed between the base substrate 600 and the base chip C0 to surround a side surface of the base connection bump 560. The underfill material layer 630 may be formed of, for example, an epoxy resin. The underfill material layer 630 may be a portion of the second molding member 640 formed in a molded underfill (MUF) manner.

In FIG. 4, elements designated by the same reference numerals as those in FIG. 1 designate similar elements in FIG. 1 and descriptions thereof will be omitted.

Figure 5:
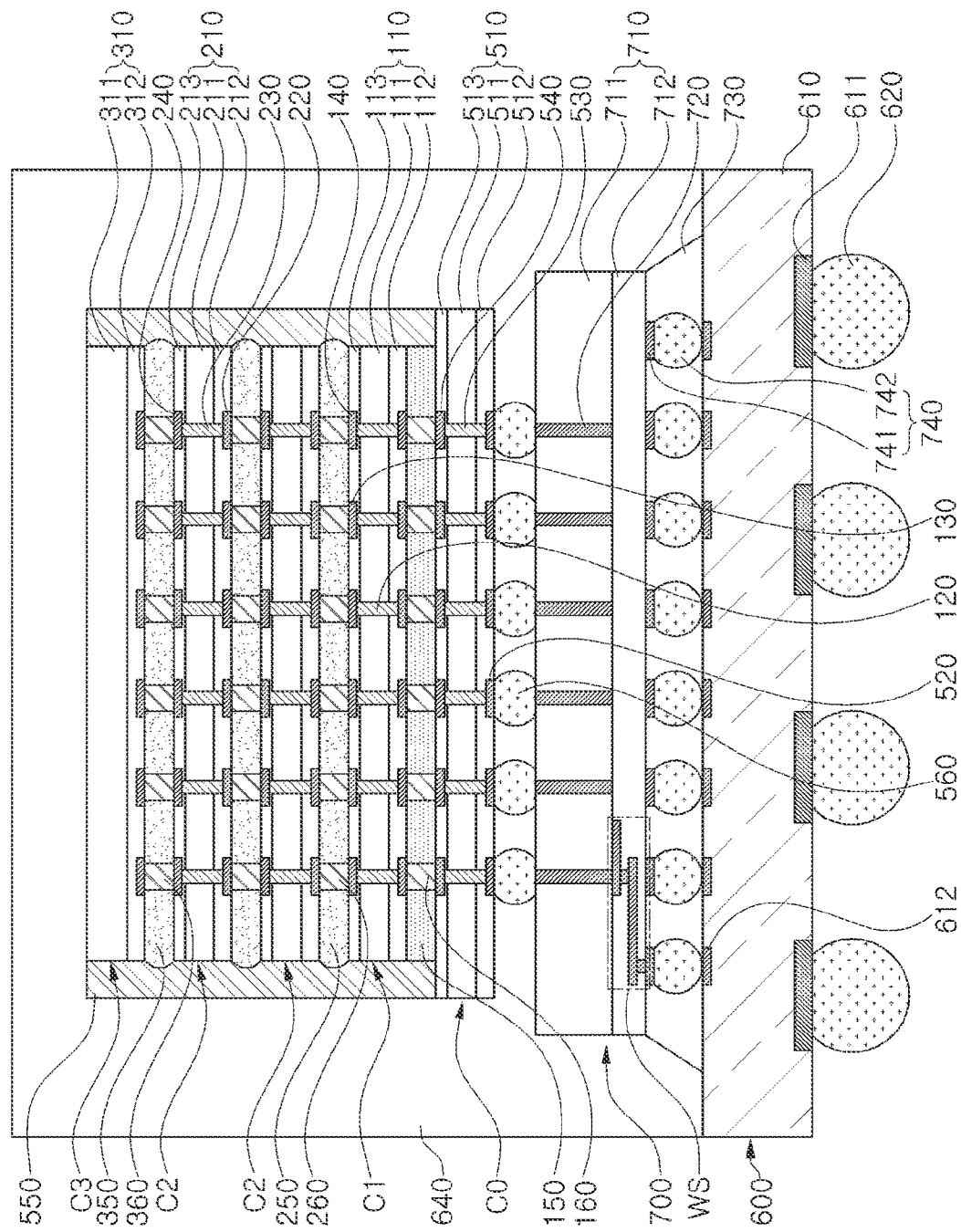
FIG. 5 is a cross-sectional view of a semiconductor package according to an example embodiment of the inventive concept.

FIG. 5 is a cross-sectional view of a semiconductor package 2b according to an example embodiment of the inventive concept.

Referring to FIG. 5, the semiconductor package 2b includes a main semiconductor chip 700 attached onto a base substrate 600, and a base chip C0 and first to third semiconductor chips C1, C2, and C3 sequentially stacked on the base substrate 600.

In an example embodiment, the main semiconductor chip 700 is a processor unit. The main semiconductor chip 700 may be, for example, a microprocessor unit (MPU) or a graphics processor unit (GPU). In some embodiments, the main semiconductor chip 700 may be a package in which a normal operation is verified, for example, a known good package (KGP). The main semiconductor chip 700 includes a main chip body 710 and main through-electrodes 720. For example, each of the base connection bumps 560 may connect to a corresponding one of the main through-electrodes 720. The main chip body 710 includes a semiconductor substrate layer 711 and a semiconductor device layer 712. Since the main through-electrodes 720 have a structure similar to a structure of each of the through-electrodes 130, 230, 330, and 530 of the base chip C0 and the first to third semiconductor chips C1, C2, and C3, a detailed description thereof will be omitted.

The through-electrodes 130, 230, 330, and 530 of the base electrode C0 and the first to third semiconductor chips C1, C2, and C3 may be electrically connected to the main through-electrode 720 of the corresponding main semiconductor chip 700. The main through-electrode 720 may be connected to a main connection terminal 740 through a wiring structure WS formed in the semiconductor device layer 712.

The main connection terminal 740 may be attached to a lower surface of the main semiconductor chip 700. The base chip C0, the first to third semiconductor chips C1, C2, and C3, and the main semiconductor chip 700 may be electrically connected to the base substrate 600 through a main connection terminal 740.

For example, the main connection terminal 740 may include a lower metal layer (UBM) 741, disposed on a lower surface of the main semiconductor chip 700, and a solder ball 742 disposed on the lower metal layer 741.

An underfill material layer 730 may be disposed between the main semiconductor chip 700 and the base substrate 600 to surround the main connection terminal 740. The underfill material layer 730 may be formed of, for example, an epoxy resin. In an example embodiment of the inventive concept, the underfill material layer 730 is a portion of a molding member 640 formed in a molded underfill (MUF) manner.

Although not illustrated in the drawing, the main connection terminal 740 may further include a main connection pillar disposed between a lower metal layer 741 and a solder ball 742. The main connection pillar may include, for example, copper.

In FIG. 5, elements designated by the same reference numerals as those in FIG. 1 designate similar elements in FIG. 1 and descriptions thereof will be omitted.

Figure 6:
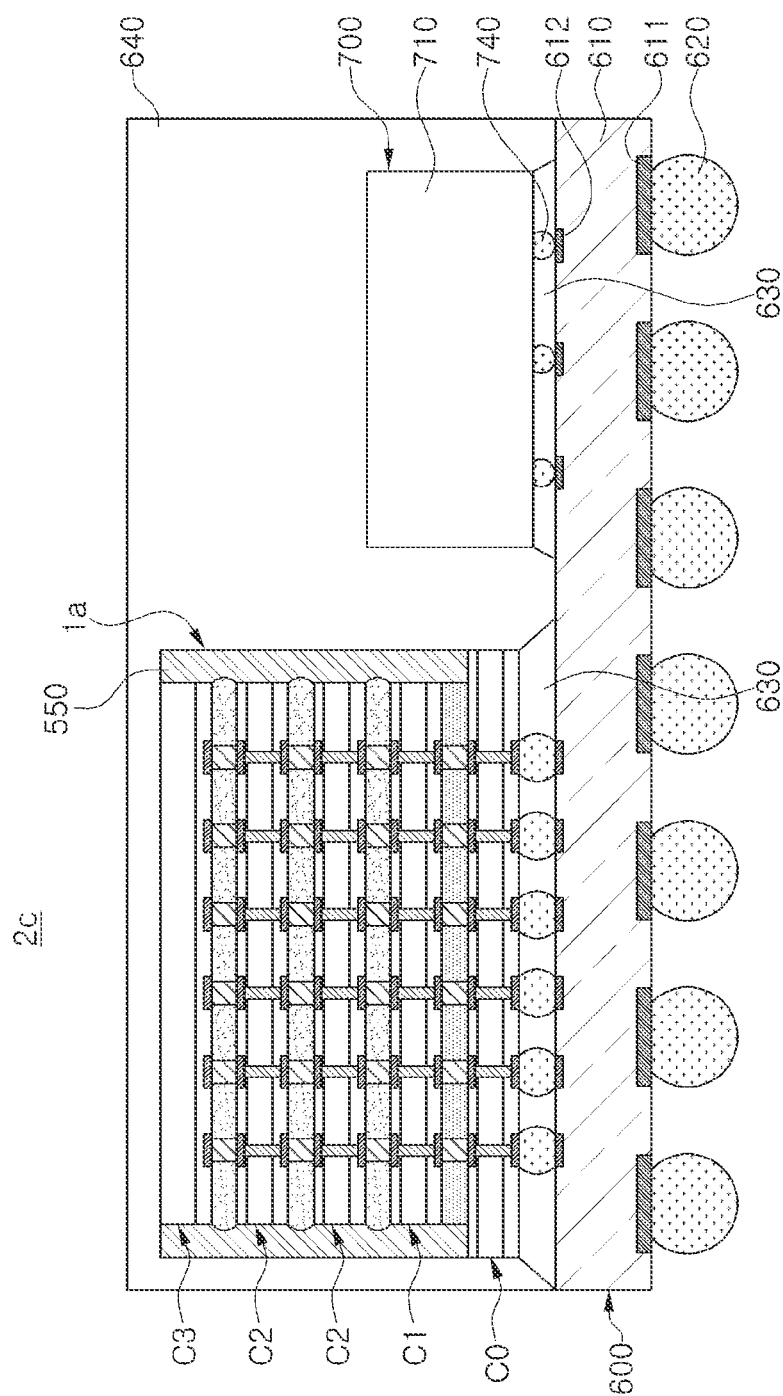
FIG. 6 is a cross-sectional view of a semiconductor package according to an example embodiment of the inventive concept.

FIG. 6 is a cross-sectional view of a semiconductor package 2c according to an example embodiment of the inventive concept.

Referring to FIG. 6, the semiconductor package 2c includes a main semiconductor chip 700 attached onto a base substrate 600, and a base chip C0 and first to third semiconductor chips C1, C2, and C3 sequentially stacked on the base substrate 600.

In an example embodiment, the main semiconductor chip 700 is a processor unit. The main semiconductor chip 700 may be, for example, a micro processor unit (MPU) or a graphics processor unit (GPU). The main semiconductor chip 700 may be a package in which a normal operation is verified, for example, a known good package (KGP). The main connection terminal 740 may be attached to a lower surface of the main body 710 of the main semiconductor chip 700. For example, the main semiconductor chip 700 may be disposed on the substrate 600 side by side with respect to the first to third semiconductor chips C1, C2, and C3 disposed on the substrate 600.

An underfill material layer 630 may be formed in a space between the base substrate 600 and the base chip C0 and a space between the base substrate 600 and the main semiconductor chip 700.

A molding member 640 may cover a side surface and an upper surface of an encapsulant 550 surrounding an upper surface of the base substrate 600, a side surface and an upper surface of the main semiconductor chip 700, and the first to third semiconductor chip C1, C2, and C3.

In FIG. 6, elements designated by the same reference numerals as those in FIG. 1 designate similar elements in FIG. 1 and descriptions thereof will be omitted.

FIGS. 7 to 13 are schematic cross-sectional views illustrating a method of manufacturing a semiconductor package 1a according to an example embodiment of the inventive concept.

Figure 7:
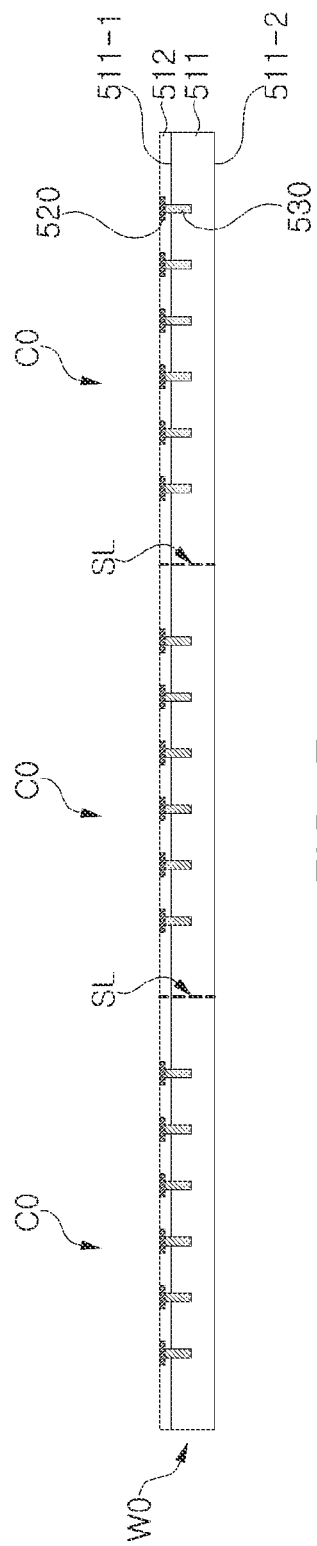
FIGS. 7 to 13 are schematic cross-sectional views illustrating a method of manufacturing a semiconductor package according to an example embodiment of the inventive concept.

Referring to FIG. 7, a first semiconductor wafer W0 is prepared. The semiconductor wafer W0 may include a plurality of base chips C0 divided into scribe lanes SL. Each of the base chips C0 includes a substrate 511, an interlayer dielectric 512, and a base through-electrode 530. The base substrate 511 has a first upper surface 511-1 and a first lower surface 511-2 opposing each other. The interlayer dielectric 512 is formed on the first upper surface 511-1 of the base substrate 511. The base through-electrode 530 is formed to extend into the base substrate 511 through the interlayer dielectric 512 from the first upper surface 511-1 of the base substrate 511.

A plurality of wiring structures may be formed in the interlayer dielectric 512, and may be electrically connected to the base through-electrode 530. A base lower connection pad 520 is formed on the interlayer dielectric 512 to be connected to the wiring structure or the base through-electrode 530.

The base through-electrode 530 may extend into the base substrate 511 from the first upper surface 511-1 of the base substrate 511. In an example embodiment, all or at least a portion of the base through-electrode 530 has a columnar shape. The base through-electrode 530 may include a barrier layer, formed on a columnar surface, and a buried conductive layer filling the inside of the barrier layer. A via insulating layer may be interposed between the base substrate 511 and the base through-electrode 530. The via insulating layer may be formed of an oxide, a nitride, a carbide, a polymer, or combinations thereof.

In an example embodiment, the base through-electrode 530 include conductive materials penetrating through the base substrate 511 having a portion removed in a subsequent process. For example, the base through-electrode 530 may include a barrier layer and a buried conductive layer filling the inside of the barrier layer. Alternatively, for example, the base through-electrode 530 may include a portion of the barrier layer, the buried conductive layer filling the inside of the barrier layer, and/or a via plug.

Figure 8:
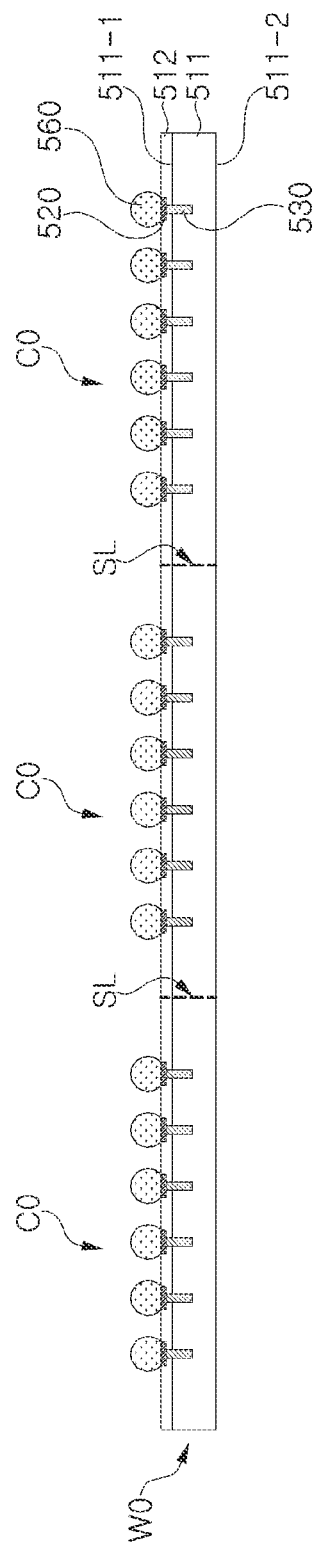

Referring to FIG. 8, a base connection bump 560 is formed on the base lower connection pad 520 electrically connected to the base through-electrode 530. As necessary, the base lower connection pad 520 may be omitted. For example, a base connection bump 560 may be formed on deposited on each of the base through-electrodes 530.

In an example embodiment, the base connection bump 560 is a solder ball. A mask pattern, having an opening exposing a portion of the base lower connection pad 520, may be formed on the interlayer dielectric 512 to form the base connection bump 560. A base connection bump 560 may be formed on a portion of the base lower connection pad 520 exposed by the mask pattern. The base connection bump 560 may be formed by an electroplating process. The mask pattern may be removed, and the base connection bump 560 may be reflowed through heat treatment to have a convex shape. For example, the base connection bump 560 may be heated until it has a convex or ball shape.

Figure 9:
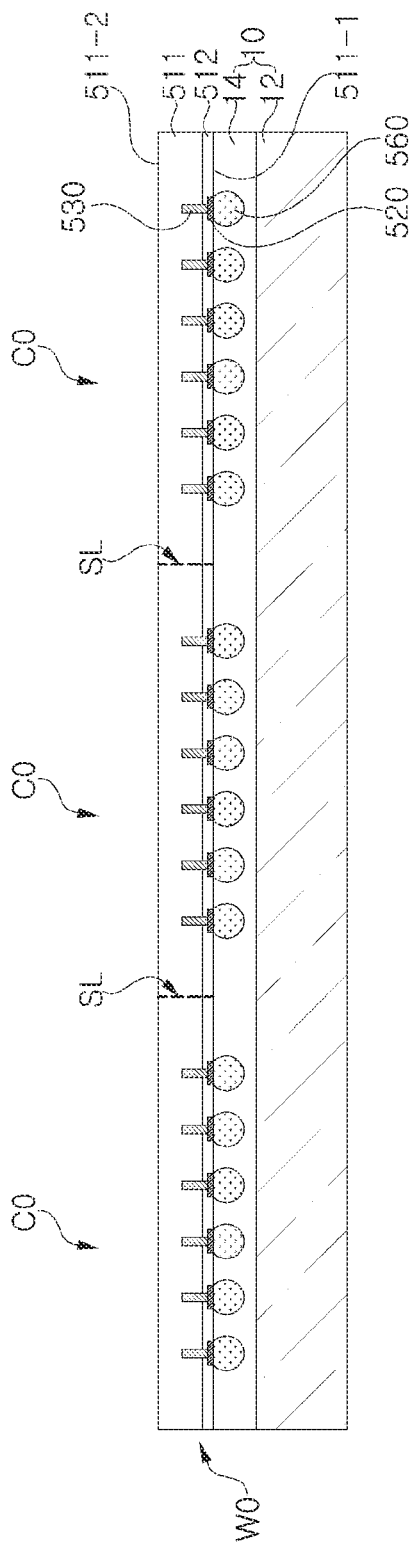

Referring to FIG. 9, the base semiconductor wafer W0, on which the base connection bumps 560 are formed, is attached to a first carrier substrate 10. The first carrier substrate 10 includes a first support substrate 12 and a first adhesive material layer 14. The base semiconductor wafer W0 may be attached to the first carrier substrate 10 such that the base connection bump 560 faces the first carrier substrate 10. The base connection bump 560 may be covered with the first adhesive material layer 14. For example, the base connection bumps 560 may be completely encapsulated by the first adhesive material layer 14. The first upper surface 511-1 of the first semiconductor substrate 100 has a portion on which the base connection bump 560 is not disposed, and the portion may be in contact with the first adhesive material layer 14.

Figure 10:
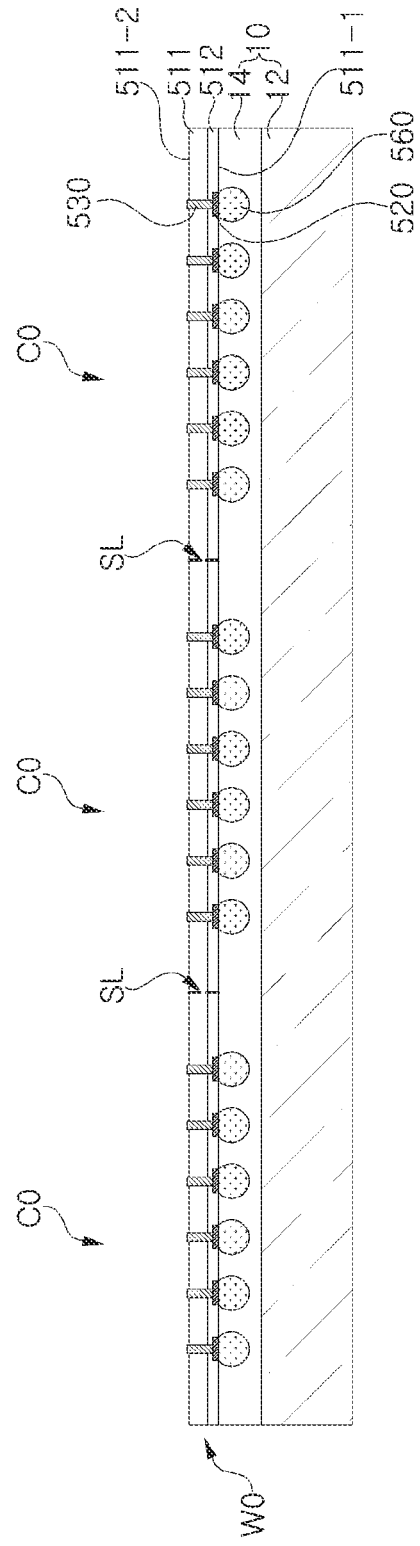

Referring to FIG. 10, a portion of the base substrate 511 is removed (e.g., etched) to expose the base through-electrode 530. The base through-electrode 530 is exposed to the first lower surface 511-2 of the base substrate 511. Since the base through-electrode 530 is exposed to the first lower surface 511-2 of the base substrate 511, the base through-electrode 530 may have a shape penetrating through the base substrate 511. Optionally, a portion of the base substrate 511 may be removed such that the base through-electrode 530 protrudes further than the first lower surface 511-2. For example, a portion of the base substrate 511 between two exposed base through-electrodes 530 could have a height greater than the exposed base through-electrodes 530.

A portion of the base substrate 511 may be removed using a chemical mechanical polishing (CMP) process, an etch-back process, or a combination thereof to expose the base through-electrode 530.

Figure 11:
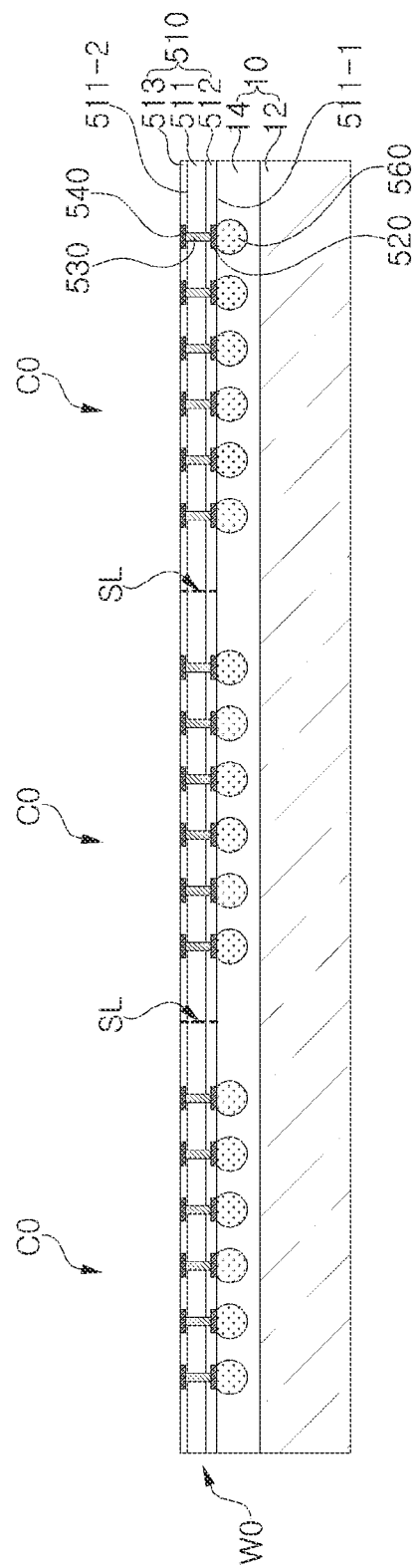

Referring to FIG. 11, a rear passivation layer 513 is formed (e.g., deposited) to cover an exposed surface of the base semiconductor wafer W0, for example, the first lower surface 511-2 of the base substrate 511. For example, the rear passivation layer 513 ultimately does not cover the exposed base through-electrodes 530, but the portions of the base substrate 511 that were etched in FIG. 10. The rear passivation layer 513 may be formed by, for example, a spin coating process or a spray process. The rear passivation layer 513 may include, for example, an insulating polymer. In order to form the rear passivation layer 513, an insulating polymer layer may be formed to cover the first lower surface 511-2 and the exposed base through-electrodes 530 of the base substrate 511, and then a portion of the insulating polymer layer may removed by an etch-back process to expose the base through-electrodes 530.

A base upper connection pad 540 is formed to be electrically connected to a portion of the base through-electrode 530 exposed by the rear passivation layer 513. For example, a base upper connection pad 540 may be formed on each of the base through-electrodes 530. Optionally, the base upper connection pad 540 is not formed and is omitted. The base upper connection pad 540 may be formed in a state in which it is embedded in the rear passivation layer 513. Accordingly, an upper surface of the base upper connection pad 540 may be coplanar or substantially coplanar with an upper surface of the rear passivation layer 513.

Figure 12:
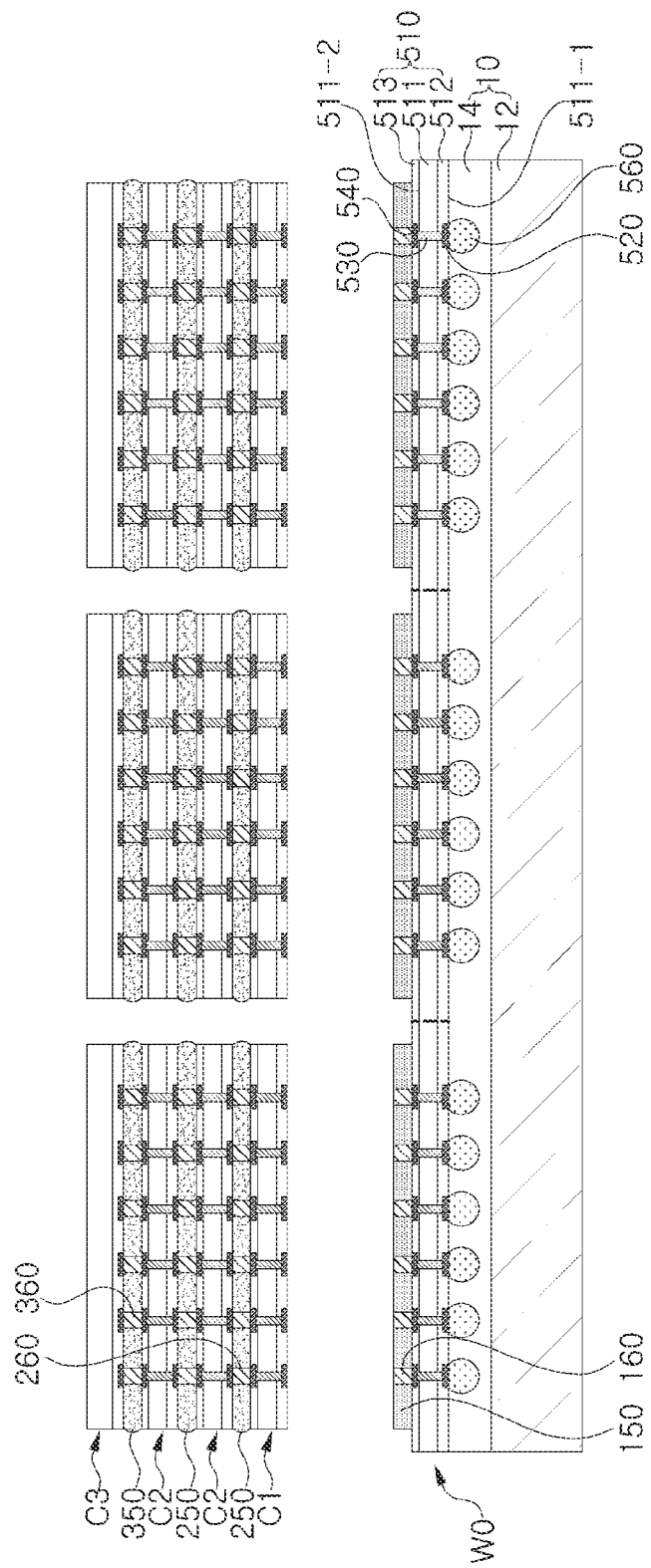

Referring to FIG. 12, first to third semiconductor chips C1, C2, and C3 may be stacked on a plurality of corresponding base chips C0 divided into scribe lanes SL, respectively. After all of the first to third semiconductor chips C1, C2, and C3 are prepared, bonding processes (for example, reflow processes or thermocompression processes) may be performed simultaneously on the first to third semiconductor chips C1, C2, and C3, or bonding processes may be sequentially performed on the first to third semiconductor chips C1, C2, and C3, respectively.

The first to third semiconductor chips C1, C2, and C3 may be prepared as individual chips by processing and cutting first to third semiconductor wafers, similarly to a method of processing the base semiconductor wafer W0 illustrated in FIGS. 7 to 11. In an example embodiment, each of the base chips C0, divided into the scribe lanes SL, have a width greater than a width of each of the first to third semiconductor chips C1, C2, and C3 prepared as individual chips.

The first to third semiconductor wafers may include the same type of individual elements. After the first to third semiconductor chips C1, C2, and C3 are attached to the carrier substrate in the form of semiconductor wafers connected to each other, they are cut and divided into the first to third semiconductor chips C1, C2, and C3. Each of the first to third semiconductor chips C1, C2, and C3 may include a semiconductor substrate, a semiconductor device layer, or a through-electrode.

A first insulating layer 150 and a first connection bump 160 are formed between the first semiconductor chip C1 and the base chip C0. The first insulating layer 150 may be formed on the rear passivation layer 513 of the base semiconductor wafer W0. Optionally, the first insulating layer 150 may be formed on a lower surface of the first semiconductor chip C1 and then attached to the rear passivation layer 513 in a bonding process. For example, the first insulating layer 150 may be a silicon oxide layer and may be formed by a common oxide deposition method. In an example embodiment, a side surface of the first insulating layer 150 is coplanar or substantially coplanar with a side surface of the first semiconductor chip C1.

In an example embodiment, the first connection bump 160 penetrates through the first insulating layer 150 and is formed in a position corresponding to the base upper connection pad 540. Optionally, similar to the first insulating layer 150, the first connection bump 160 may be formed below the first semiconductor chip C1, and then may be in contact with the base upper connection pad 540 in a bonding process. For example, the first connection bump 160 may be a copper pillar and may be formed by electroplating.

A second insulating layer 250 and a second connection bump 260 may be formed on a lower surface of the second semiconductor chip C2. The second insulating layer 250 may be formed between the first semiconductor chip C1 and the second semiconductor chip C2 or may be formed between the plurality of second semiconductor chips C2. For example, the second insulating layer 250 may be a non-conductive film, and the first semiconductor chip C1, the second semiconductor chip C2, and the second semiconductor chips C2 may be attached to each other by a thermal compression process. In an example embodiment, a side surface of the second insulating layer 250 protrudes outward further than side surfaces of the first, second, and third semiconductor chips C1, C2, and C3.

In an example embodiment, the second connection bump 260 penetrates through the second insulating layer 250 and is formed in a position corresponding to the second lower connection pad 220. For example, the second connection bump 260 may be a copper pillar, but may be different in type from the first connection bump 160.

A third insulating layer 350 and a third connection bump 360 may be formed on the lower surface of the third semiconductor chip C3. The third insulating layer 350 and the third connection bump 360 may have technical features substantially similar to those of the second insulating layer 250 and the second connection bump 260.

Since the first insulating layer 150 includes a material different from a material of the second insulating layer 250 and the third insulating layer 350, heat dissipation characteristics of a semiconductor package, in which a plurality of semiconductor chips are stacked, may be improved and manufacturing productivity of the package may be maintained at a constant level.

Figure 13:
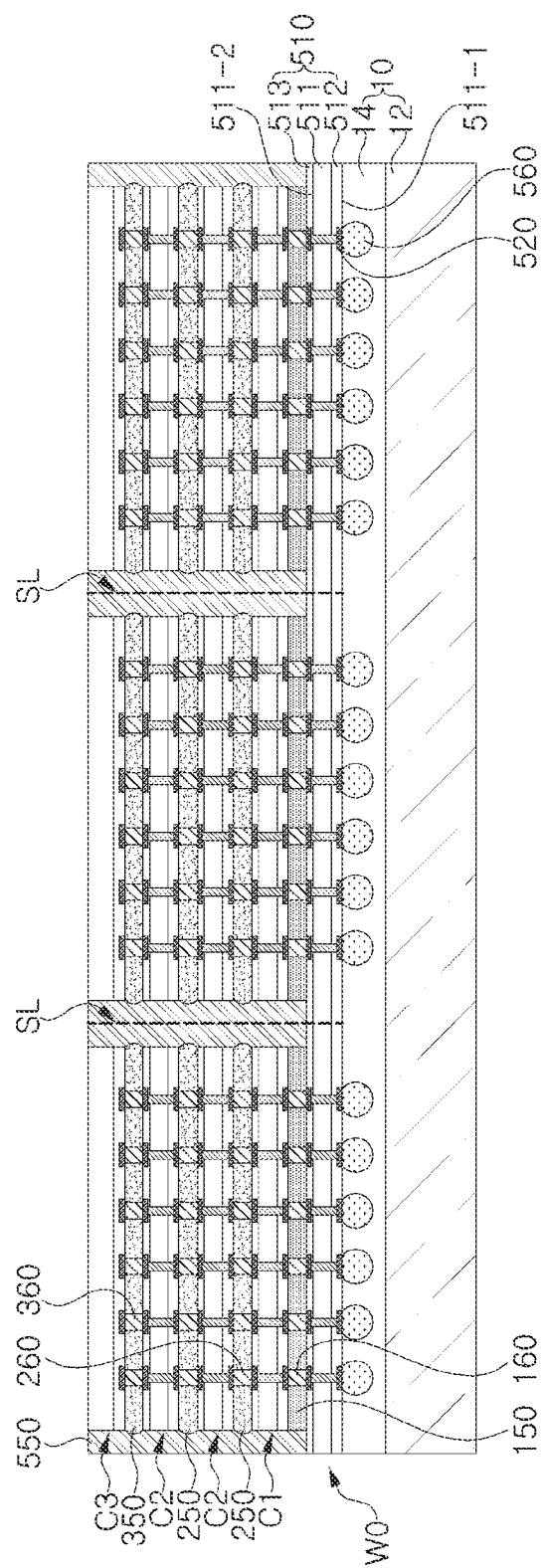

Referring to FIG. 13, an encapsulant 550 is formed on a first carrier substrate 10 to cover the base semiconductor wafer W0 and the first to third semiconductor chips C1, C2, and C3. The encapsulant 550 may be formed to cover an upper surface of each of the plurality of base chips C0 divided into the scribe lanes SL and the side surfaces of the first to third semiconductor chips C1, C2, and C3. An upper surface of the third semiconductor chip C3 may be exposed from the encapsulant 550 by a chemical-mechanical polishing (CMP) process. The encapsulant 550 may include an epoxy mold compound (EMC). Then, the resulting structure may be cut along the scribe lanes SL to be divided into individual semiconductor packages As described above, according to example embodiments of the inventive concept, different types of insulating layers may be formed between stacked semiconductor chips. Thus, a semiconductor package having improved heat dissipation characteristics and improved productivity may be provided.

While example embodiments of the inventive concept have been shown and described above, it will be apparent to those skilled in the art that various modifications could be made in these embodiments without departing from the scope of the present inventive concept.

What is claimed is:

1. A semiconductor package comprising:
   a base chip;
   a first semiconductor chip disposed on the base chip;
   at least one second semiconductor chip disposed on the first semiconductor chip;
   a first insulating layer disposed on a lower surface of the first semiconductor chip;
   at least one second insulating layer disposed on a lower surface of the at least one second semiconductor chip;
   a first connection bump penetrating through the first insulating layer and connecting the base chip and the first semiconductor chip to each other; and
   a second connection bump penetrating through the second insulating layer and connecting the first semiconductor chip and the at least one second semiconductor chip to each other,
   wherein a width of the at least one second insulating layer in a first direction is greater than a width of the first insulating layer in the first direction.

2. The semiconductor package of claim 1, wherein the first insulating layer is a silicon oxide layer, and the second insulating layer is a non-conductive film (NCF).

3. The semiconductor package of claim 1, wherein the first insulating layer has a side surface coplanar with a side surface of the first semiconductor chip, and the second insulating layer has a side surface protruding further outward than the side surface of the first semiconductor chip.

4. The semiconductor package of claim 1, wherein the first connection bump includes a conductive pillar, and the second connection bump includes a solder ball.

5. The semiconductor package of claim 1, wherein the base chip has a width greater than a width of each of the first and second semiconductor chips.

6. The semiconductor package of claim 1, further comprising:
   an encapsulant covering an upper surface of the base chip and side surfaces of each of the first and second semiconductor chips.

7. The semiconductor package of claim 6, wherein the encapsulant has a side surface coplanar with a side surface of the base chip.

8. The semiconductor package of claim 1, wherein the first semiconductor chip has a same width as the second semiconductor chip.

9. A semiconductor package comprising:
a base chip;
at least one first semiconductor chip disposed on the base chip;
at least one second semiconductor chip disposed on the at least one first semiconductor chip;
at least one first insulating layer disposed on a lower surface of the at least one first semiconductor chip;
at least one second insulating layer disposed on a lower surface of the at least one second semiconductor chip;
a first connection bump penetrating through the first insulating layer and connecting the base chip and the at least one first semiconductor chip to each other; and
a second connection bump penetrating through the second insulating layer and connecting the at least one first semiconductor chip and the at least one second semiconductor chip to each other,
wherein the at least one first insulating layer has a first side surface between the base chip and the at least one first semiconductor chip,
wherein the at least one second insulating layer has a second side surface between the at least one first semiconductor chip and the at least one second semiconductor chip,
wherein the first side surface is a flat surface extending in a direction intersecting the lower surface of the at least one first semiconductor chip, and
wherein the second side surface is a convex surface protruding further outward than the first side surface.

10. The semiconductor package of claim 9, wherein the first insulating layer has a width the same as that of the first semiconductor chip.

11. The semiconductor package of claim 9, wherein the second insulating layer has a width greater than that of the first semiconductor chip.

12. The semiconductor package of claim 9, further comprising:
a third semiconductor chip disposed on the second semiconductor chip;
a third insulating layer disposed between the second semiconductor chip and the third semiconductor chip; and
a third connection bump penetrating through the third insulating layer and connecting the second semiconductor chip and the third semiconductor chip to each other.

13. The semiconductor package of claim 12, wherein each of the first connection bump, the second connection bump, and the third connection bump includes a conductive pillar.

14. The semiconductor package of claim 12, further comprising:
an encapsulant covering an upper surface of the base chip and side surfaces of each of the second and third semiconductor chips.

15. The semiconductor package of claim 14, wherein the third semiconductor chip has an upper surface exposed via an opening in the encapsulant.

16. A semiconductor package comprising:
a base chip;
at least one first semiconductor chip disposed on the base chip;
at least one second semiconductor chip disposed on the at least one first semiconductor chip;
at least one first insulating layer disposed on a lower surface of the at least one first semiconductor chip;
at least one second insulating layer disposed on a lower surface of the at least one second semiconductor chip;
a first connection bump penetrating through the first insulating layer and connecting the base chip and the at least one first semiconductor chip to each other; and
a second connection bump penetrating through the second insulating layer and connecting the at least one first semiconductor chip and the at least one second semiconductor chip to each other,
wherein the at least one first insulating layer and the at least one second insulating layer include materials different from each other.

17. The semiconductor package of claim 16, wherein the first insulating layer includes a silicon oxide layer.

18. The semiconductor package of claim 16, wherein the second insulating layer includes non-conductive films.

19. The semiconductor package of claim 16, further comprising:
an encapsulant covering side surfaces of each of the first and second insulating layers.

20. The semiconductor package of claim 19, wherein a contact area between the side surface of the second insulating layer and the encapsulant is greater than that between the side surface of the first insulating layer and the encapsulant.

* * * * *